United States Patent

[11] 3,617,816

[72] Inventors Jacob Riseman; Paul A. Totta, both of Poughkeepsie, N.Y.
[21] Appl. No. 7,618
[22] Filed Feb. 2, 1970
[45] Patented Nov. 2, 1971
[73] Assignee International Business Machines Corporation Armonk, N.Y.

[54] COMPOSITE METALLURGY STRIPE FOR SEMICONDUCTOR DEVICES
6 Claims, 5 Drawing Figs.

[52] U.S. Cl. .......... 317/234 R, 317/234 F, 317/234 M, 317/234 N, 317/235 Y, 338/22, 338/17, 338/13
[51] Int. Cl. .......... H01l 3/00, H01l 5/00
[50] Field of Search .......... 317/234, 235, 5.2, 5.3, 5.4, 101; 338/22, 13, 17, 20; 29/583–589, 195

[56] References Cited

UNITED STATES PATENTS

| | | | |
|---|---|---|---|
| 3,310,711 | 3/1967 | Hangstefer | 317/235 |
| 3,386,011 | 5/1968 | Murray et al. | 317/234 |
| 3,461,357 | 8/1969 | Mutter et al. | 317/234 |
| 3,287,612 | 11/1966 | Lepseiter | 317/235 |
| 3,382,099 | 5/1968 | Montmory | 317/234 X |
| 3,507,756 | 4/1970 | Wenger | 317/235 X |

*Primary Examiner*—John W. Huckert
*Assistant Examiner*—Andrew J. James
*Attorney*—Hanifin and Jancin

ABSTRACT: A metallurgy interconnection system for semiconductor devices made up of laminar stripes, each having a layer of gold disposed between layers of tantalum.

PATENTED NOV 2 1971 3,617,816

INVENTORS
PAUL A. TOTTA
JACOB RISEMAN

BY Wolmar J. Stoffel
ATTORNEY

COMPOSITE METALLURGY STRIPE FOR SEMICONDUCTOR DEVICES

BACKGROUND OF THE INVENTION

Semiconductor devices, notably transistors, diodes, etc. have revolutionized the electronics industry by replacing electron tubes in a majority of applications. This has made possible the miniaturization of electronic equipment and increased its efficiency, dependability, etc. Monolithic and thin film integrated semiconductor devices show promise of achieving even greater miniaturization, greater dependability and savings in cost.

Monolithic devices, in general, consist of a single crystal of a semiconductor material, typically silicon, having various diffused P and N type regions, and combinations thereof, which constitute active and passive individual elements. These elements are electronic circuits with etched conductor stripes on the device which are normally insulated by thermal oxide and glass layers.

The design trend in monolithic integrated circuits has moved rapidly in the direction of using smaller, faster devices and circuits in ever increasing numbers on a single silicon chip. To shorten the electrical path between the active and passive elements, much of the wiring which was formally done on modules or printed circuit cards is now done on second and third metallurization levels on the ship. One of the present significant design limitations for the miniaturization trend is the device metallurgy technology. The extent of reduction of size of the conductor stripes is restricted purely by intrinsic metal properties such as electromigration capabilities or conductivity, and also by processing limitations such as the ability to shape the conductive metallurgy film by photolithography and subtractive etching.

The ideal metallurgy system for advanced integrated circuits must be compact, and make efficient use of conductors and the available space. It should have narrow, thin interconnection stripes; narrow to allow the greatest horizontal packing density of silicon devices, and thin to avoid the excessive build up of the laminated metallurgy-insulator structure. However, the small cross section must be consistent with current carrying reliability requirements. The silicon or semiconductor contact and of the striped metallurgy must be ohmic, low in resistance, and stable. Also, the device interconnection must meet the module or carrier conductors through a compatible terminal design.

While the fabrication of conductor stripes on integrated circuit devices is relatively simple in principle, the operations present many practical difficulties in regard to the selection of compatible materials, fabrication, alignment of masks, adherence, interaction and alloying effects of materials, etc. Further, due to the very limited space available, the circuitry is very dense. This imposes serious constraints on width and thickness of the conductive stripes, contact areas, etc. which result in relatively high current densities. The metal comprising the system must be strongly adherent to silicon oxide and also to the glass encapsulating medium. If the glass forming the seal is not mechanically adherent to the metallurgy network, subsequent processing and/or high-temperature operations will tend to disrupt the seal permitting contamination thus necessitating rejection of the semiconductor device. The metal of the metallurgy network system in intimate contact with the semiconductor must alloy with the silicon crystal in order to provide good ohmic contact, must not degrade device reliability by oxide penetration, and must contribute a minimum to the electrical resistance in its function as a connection between the active regions of the device and the external terminal connections.

There are a very limited number of metals having a sufficiently high conductivity to satisfy the demanding requirements of integrated circuit devices conductive metallurgy systems. The metals are silver, copper, gold, aluminum, tungsten and molybdenum. While there are other metals which may have somewhat higher conductivities than the tungsten and molybdenum, these metals are too reactive or rare to be considered. The most simple metallurgy system consists of a single metal. Of the group, aluminum, tungsten, and molybdenum can be used as a single metal system since all bond to the silicon oxide and glass. However, aluminum does not have sufficiently high resistance to electromigration when utilized in high-current applications. Tungsten and molybdenum have conductivities which require relatively thick metallurgical stripes. This would cause difficulty in multilevel systems. Of the three remaining, namely silver, copper and gold, their use depends on including an additional layer to bond the conductive metal to the insulating layers.

A number of types of composite laminar metallurgy structures are known, such as alternate layers of Cr-Ag-Cr, as described in U.S. Pat. No. 3,290,565, and Mo-Au as described in U.S. Pat. No. 3,290,570. The designing of a composite metallurgy stripe is more than merely selecting a center conductive layer of highly conductive metal and a suitable adhesive layer which will bond to the conductive layer to glass. To meet the demanding requirements of modern integrated circuit technology, the combination must be highly resistive to electromigration, not alloy to form a more highly resistive alloy, not form an electrical couple which would subject the composite stripe to corrosion.

SUMMARY OF THE INVENTION

It is an object of this invention to provide an improved conductive stripe structure for use in planar-type semiconductor devices.

It is another object of the invention to provide a new and improved interconnection metallurgy stripe for semiconductor devices which affords long term reliability under relatively high-temperature and high-current conditions, insofar as the structure is highly resistant to electromigration.

Still another object of this invention is to provide a new interconnection metallurgy stripe structure that is highly resistant to corrosion, and which will not experience a unduly high increase in conductivity during exposure to elevated temperatures that may be encountered during fabrication and/or operation.

In accordance with the aforementioned objects of the invention, the metallurgy structure of the invention for a planar semiconductor device has at least one conductive stripe overlying and bonded to the surface of a layer of silicon dioxide, or equilivant insulating layer. The stripe is comprised of a layer of gold disposed between layers of tantalum. Preferably a layer of glass overlies the stripe.

BRIEF DESCRIPTION OF THE DRAWING

The foregoing and other objects, features and advantages of the invention will be apparent from the more particular description of a preferred embodiment of the invention as illustrated in the accompanying drawings.

DESCRIPTION OF THE PREFERRED EMBODIMENT

Figure 1:
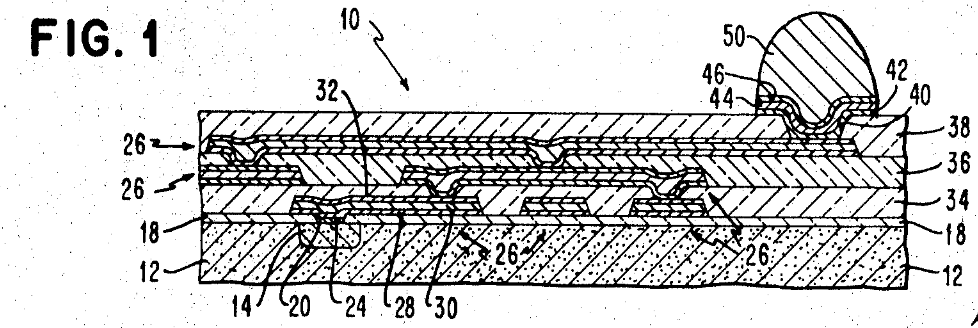
FIG. 1 is a cross-sectional view of a preferred embodiment of a multilevel metallurgy interconnection system of the invention for a hermetically sealed planar semiconductor device.

Referring now the drawings there is shown in FIG. 1, a preferred embodiment of the metallurgy system for a semiconductor device. Device 10 includes a body 12 of monocrystalline semiconductor material such as silicon, germanium, or the like. Ordinarily, body 12 is doped with either an N-or P-type dopant. Body 12 includes a region 14 having an opposite type impurity. Region 14 can be formed by diffusion, ion implanatation, or etch and refill techniques, all of which are known to the art. Only a single region 14 is shown in body 12 although it is understood that in practice there will be many oppositely doped regions in body 12 which will serve as resistors, diodes, transistors, etc. Further, the upper portion of body 12 can be formed by epitaxial deposition which is well known in the art. An insulating layer 18 is bonded to body 12. Layer 18 is conventionally a layer of thermal oxide, when the body 12 is of silicon. Alternately layer 18 could be a composite layer of $SiO_2$ and $Si_3N_4$. Aperture 20 is formed in 18 by a conventional photolithographic techniques over region 14. A ohmic contact layer 24, typically palladium silicide or platinum silicide, is formed in direct contact with the upper surface of region 14. Stripe 26 is shown contacting region 14 through layer 24 and extending outwardly to form a part of the conductive metallurgy network of the device. Conductive stripe 26 includes a lower layer of tantalum 28, an intermediate conductive layer of gold 30, and an upper layer of tantalum 32. As shown in FIG. 1 the device can include a plurality of conductive metallurgy stripes 26 interconnected to form a complex circuit network. A suitable insulating layer 34 of glass, silica, or a composite layer, as for example $SiO_2$ and silicon nitride, overlies the lower layer of the conductive network of stripes 26. In like manner, insulating layers 36 and 38 overlie the second and third stripe metallurgy layer which are electrically connected. An aperture 40 is made through the upper layer 38 of insulating material and a suitable terminal contact made to the device. In practice the device will contain many such terminals. As shown in FIG. 1, the terminal consists of a solder wettable pad which includes a lower layer 42 of chromium, an intermediate layer 44 of copper or nickel, and preferably an upper layer 46 of gold. A solder mound 50 is formed on the pad. In practice the device is placed in position and heated to melt the solder pad or the underlying land to obtain an electrical connection between the device and a suitable supporting substrate.

In forming the device pictured in FIG. 1, care must be taken to provide a suitable thick lower layer 28 of tantalum particularly on the lower level of the device so that the gold layer 30 is effectively prevented from coming into contact with the semiconductor material. Gold will alloy with silicon at a temperature of 370° C. forming a eutectic which destroys or can destroy the device. The thickness of the lower tantalum layer can vary depending on the particular application and details of processing, with the lower limit being on the order of 200 angstroms.

The stripe 26 of the invention can be deposited on the semiconductor device in any suitable manner. A useful mode of deposition is by sputter deposition, preferably by alternately depositing the respective Ta, Au and Ta layers from Ta and Au targets within the chamber of the apparatus. A complete composite layer can be deposited without opening the chamber if a suitable mechanism is provided to move the substrates or targets within the chamber. Alternately the composite layer can be deposited by evaporation techniques or plating techniques. After the blanket layer of Ta, Au, and Ta is deposited, it must be processed to form the desired circuit configuration. This can best be accomplished by sputter etching, in which the layer is masked and the device made the target in a sputtering apparatus. The exposed regions are removed by bombardment and erosion which is known in the art. Due to the difficulty of obtaining etchants which are sufficiently selective to Ta, Au, and glass, sputter etching is preferred.

The overlying layer of insulating material is then deposited, either by pyrolytic deposition, sputter deposition, or other suitable techniques. The via holes, when a multilevel metallurgy system is employed, can be formed by chemical etching. The ohmic contact layer 24 of platinum silicide or palladium silicide is deposited by techniques known to the art.

In practice the thickness of the overall stripe will be in the range of ½ to 3 microns, with the resultant stripe capable of reliably conducting current densities on the order of $5\times10^5$ amps/cm$^2$.

Figure 2:
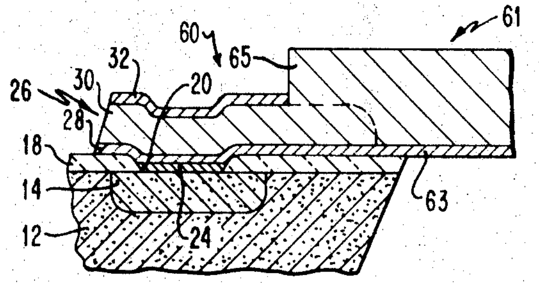
FIG. 2 and 2*a* are fragmentary views in cross section of preferred embodiments of the invention.

Referring now to FIG. 2 of the drawing there is depicted another preferred specific embodiment, 60 of the metallurgy system of the invention. Device 60 includes a body of semiconductor material 12 having fabricated therein a region 14 embodying a dopant different from the dopant contained in body 12. An insulating layer of 18 of amorphous inorganic material provided with an opening 20 is bonded to the top surface of body 12. An ohmic contact layer 24 similar to that described in the embodiment of FIG. 1 is in intimate contact with the top surface of region 14. A metallurgy system is adhered to layer 18 which includes a network of stripes 26, each having a lower Ta layer 28, an intermediate Au layer 30, and an upper Ta layer 32. A beam lead terminal 61 is shown connected to stripe 26. The terminal 61 consists of a lower tantalum layer 63 and a relatively thick Lyer of gold 65, which can be bonded to a suitable carrier or substrate using conventional joining techniques. If desired, alternate structure or techniques can be used to make an electrical connection between the device 60 and a carrier or substrate. The basic differences between the embodiment 60 shown in FIG. 2, and the embodiment 10 shown in FIG. 1, is that 60 does not include a layer of glass over stripe 26 and is limited to a single level.

Figure 2A:
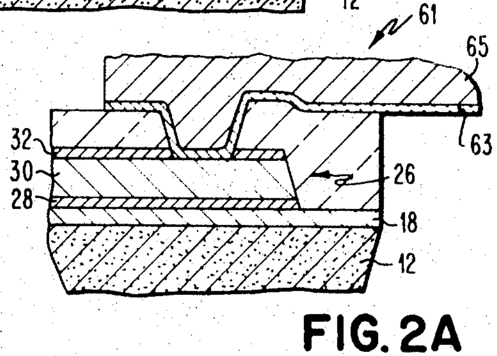

The beam lead 61 can be made with glass over the stripe 26 but not over the beam lead, as illustrated in FIG. 2*a*.

Figure 3:
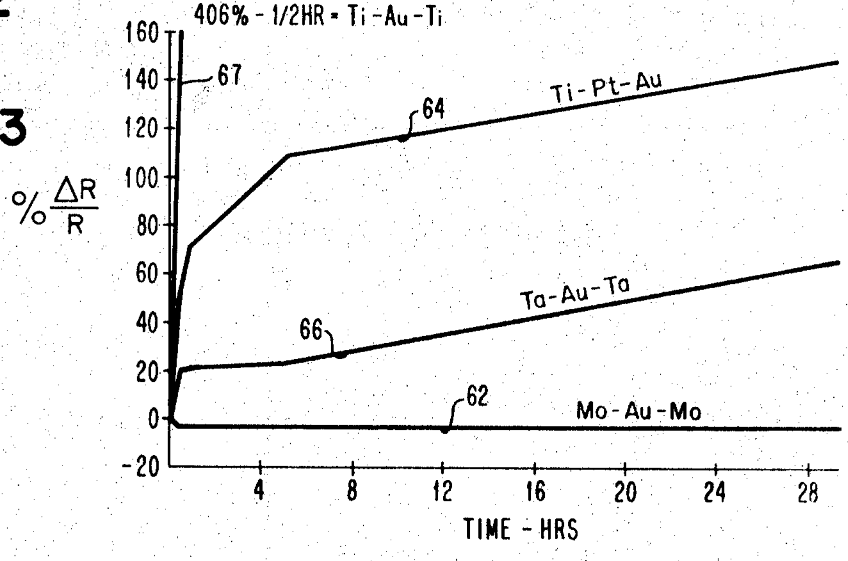
FIG. 3 is a graph depicting the comparison between resistance change during heat treatment at 500° C. for the metallurgy stripe of the invention and other conductive stripes.

The data depicted in FIG. 3 of the drawings was experimentally obtained to illustrate the interaction between Au and various types of adhesive layers in a metallurgy stripe exposed to heat treatments. These curves represent high-stress conditions. Each curve in FIG. 3 illustrates the change in resistance of the various metallurgy stripe specimens after exposure at a temperature of 500° C. in a forming gas composed of 90percent nitrogen and 10percent hydrogen. Curve 67 relating to a metallurgy structure consisting of a conductive Au layer sandwiched between two Ti adhesive layers experienced a 406 percent increase in resistance in the first half hour of testing. Curve 62 directed to a stripe consisting of a Au conductive layer sandwiched between Mo layers experienced no significant resistivity increase even after prolonged exposure to high temperatures. This would appear to be a good metallurgy stripe structure. However Mo and Au form a voltaic couple which is highly subject to corrosion, particularly in a humid environment. Unless a device utilizing such a metallurgy structure is completely and effectively passivated, i.e., sealed from the ambient, failure due to corrosion is probable. Curve 64 directed to a gold conductive layer combined with a Ti underlying layer and a platinum barrier layer exhibited a significant increase in resistivity with time. The increase was not as dramatic as that of curve 67 although it was of sufficient magnitude to render such a stripe impractical for high current usages. Curve 66 is directed to a metallurgy stripe consisting of Au conductive layer sandwiched between two Ta adhesive layers, which is the subject stripe of the invention. As the curve indicates there is an increase in resistivity with exposure to the aforementioned heated environment. The resistivity increase shown does not place any restriction on the processing of devices, nor on their application. Further, the Ta Au Ta stripe when compared to a Mo Au Mo or Mo Au stripe is highly resistant to corrosion. Further the stripe is very resistant to electromigration.

The stripe of the invention is significantly more resistant to corrosion and electromigration.

Figure 4:
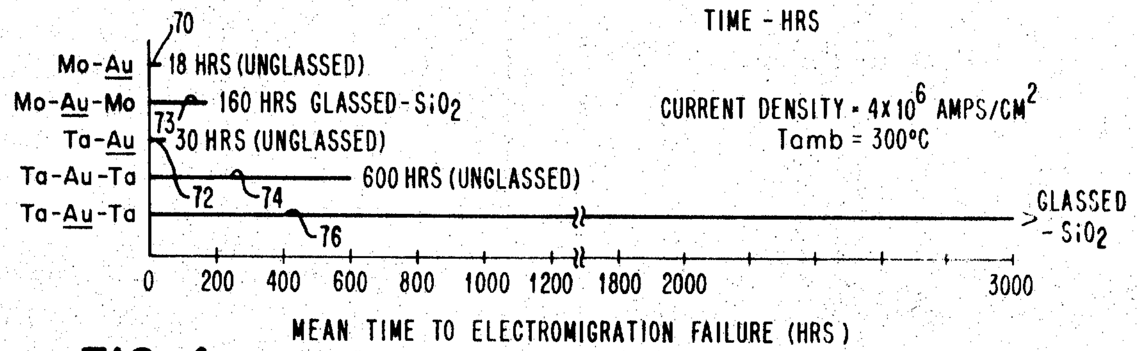
FIG. 4 is a bar graph illustrating electromigration resistance of various Au stripe structures.

Referring now to FIG. 4 of the drawings the data depicted illustrates the unobvious and unexpected increase in the resistance to electromigration of the stripe configuration of the invention. FIG. 4 is a bar graph depicting several conductive stripe structures utilizing a Au conductive layer showing the mean time to failure due to electromigration when subjected to a current of $4\times10^6$ amperes/cm.$^2$ and 300° C. ambient temperature. They illustrate the results of highly accelerated reliability testing on stripes 0.3 mil wide by 10 mils long by 2 micron thick on $SiO_2$ over Si. Bars 70 and 72 for a Mo-Au and Ta-Au stripe structure respectively indicate electromigration failure relatively early with the Ta-Au stripe exhibiting a greater degree of electromigration resistance. Neither of the structures include a top surface layer of the Mo or Ta and were both unglassed. Bar 74 is directed to a Ta-Au-Ta stripe configuration without an overlying layer of glass which structure is similar to that depicted in FIG. 2 of the drawing. Note that the upper layer of Ta very significantly increased the resistance to electromigration since the time to failure was materially increased, when compared to bar 72 for Ta and Au. Bar 76 indicates the very marked increase in resistance to electromigration obtained by covering the Ta-Au-Ta stripe of the invention with an overlying layer of glass. Comparing 76 and 74 indicates that the time to failure was increased five times, under the accelerated conditions. Under device operating conditions which could be as high as 100° C. function temperature and $0.5\times10^5$ amps/cm.$^2$ current density in the stripe, this would correspond to an electromigration improvement of thousands of times, or a reliability improvement of three orders of magnitude. Thus, FIG. 4 clearly illustrates that the stripe configuration of the invention, i.e., a Ta Au Ta stripe, has significantly more resistance to electromigration than the Mo-Au stripe and also Ta-Au stripe. FIG. 4 particularly illustrates the marked increase obtained by covering the stripe of the invention with a layer of glass.

While the invention has been particularly shown and described with reference to preferred embodiments thereof, it will be understood by those skilled in the art that various changes in form and detail may be made therein without departing from the spirit and scope of the invention.

What is claimed is:

1. An improved interconnection metallurgy system for a planar semiconductor device having a semiconductor body, a bonded insulating layer of amorphous inorganic material overlying the body, and a layer of conductive stripes bonded to said insulating layer and an electrical contact with said semiconductor body, the improvement comprising:

said conductive stripe comprised of a layer of Au disposed between layers of Ta an amorphous inorganic insulating layer overlying said layer of conductive stripes, said stripe being highly resistant to electromigration.

2. The metallurgy system of claim 1 which further includes an ohmic contact layer of material selected from the group consisting of palladium silicide and platinum silicide disposed in intimate electrical contact with said semiconductor body.

3. The metallurgy system of claim 1 which includes a plurality of interconnected layers of conductive stripes disposed between a plurality of insulating layers providing a complex multilayer circuit network.

4. A semiconductor device comprising, a semiconductor body, an insulating layer disposed on the top surface of said body, and, a network of conductive stripes bonded to said insulating layer, and in electrical contact with said semiconductor body, each of said conductive stripes comprised of a layer of Au disposed between layers of Ta an insulating layer of amorphous inorganic material overlying said network of conductive stripes, said stripes being highly resistant to corrosion and electromigration.

5. The semiconductor device of claim 4 which includes terminal solder mounds disposed on the surface of the upper insulating layer and in electrical contact to said underlying network of conductive stripes.

6. The semiconductor device of claim 4 which includes a beam lead terminal which makes electrical contact to said conductive stripes through a via hold in said insulating layer.

* * * * *